United States Patent
Hellberg (10) Patent No.: US 11,652,452 B2
(45) Date of Patent: May 16, 2023

(54) WIDEBAND POWER AMPLIFIER ARRANGEMENT

(71) Applicant: Telefonaktiebolaget LM Ericsson (publ), Stockholm (SE)

(72) Inventor: Richard Hellberg, Huddinge (SE)

(73) Assignee: TELEFONAKTIEBOLAGET LM ERICSSON (PUBL), Stockholm (SE)

( * ) Notice: Subject to any disclaimer, the term of this patent is extended or adjusted under 35 U.S.C. 154(b) by 158 days.

(21) Appl. No.: 16/500,923

(22) PCT Filed: Apr. 6, 2017

(86) PCT No.: PCT/SE2017/050342
§ 371 (c)(1),
(2) Date: Oct. 4, 2019

(87) PCT Pub. No.: WO2018/186776
PCT Pub. Date: Oct. 11, 2018

(65) Prior Publication Data
US 2020/0136573 A1   Apr. 30, 2020

(51) Int. Cl.
*H03F 3/21* (2006.01)
*H03F 1/02* (2006.01)
(Continued)

(52) U.S. Cl.
CPC .......... *H03F 3/211* (2013.01); *H03F 1/0277* (2013.01); *H03F 1/18* (2013.01); *H03F 3/195* (2013.01);
(Continued)

(58) Field of Classification Search
CPC .......... H03F 3/211; H03F 1/0277; H03F 1/18; H03F 3/195; H03F 2200/09;
(Continued)

(56) References Cited

U.S. PATENT DOCUMENTS

| 4,748,421 A | 5/1988 | Schilling et al. |
| 7,271,657 B2 * | 9/2007 | Friedrich ............ H03F 3/45183 330/286 |

(Continued)

FOREIGN PATENT DOCUMENTS

| JP | S58146108 A | 8/1983 |
| JP | S59208913 A | 11/1984 |

(Continued)

OTHER PUBLICATIONS

International Search Report and the Written Opinion of the International Searching Authority, issued in corresponding International Application No. PCT/SE2017/050342, dated Jul. 24, 2017, 13 pages.

(Continued)

*Primary Examiner* — Lincoln D Donovan
*Assistant Examiner* — Khiem D Nguyen
(74) *Attorney, Agent, or Firm* — Rothwell, Figg, Ernst & Manbeck, P.C.

(57) ABSTRACT

A power amplifier arrangement (200) for amplifying an input signal to produce an output signal comprises a plurality N of amplifier sections (212, 213), a first input transmission line (221) comprising multiple segments and a first output transmission line (231) comprising multiple segments. Each amplifier section comprises one or more first transistors (T1) distributed along the first input transmission line (221) and the first output transmission line (231). Each amplifier section is configured to amplify a portion of the input signal to produce a portion of the output signal. A portion of the input signal is one of N portions of the input signal partitioned on any one or a combination of an amplitude basis and a time basis. The output signal is produced at an end of the first output transmission line (231)

(Continued)

by building up N potions of the output signal from each amplifier section.

13 Claims, 10 Drawing Sheets

(51) Int. Cl.
  *H03F 1/18* (2006.01)
  *H03F 3/195* (2006.01)
(52) U.S. Cl.
  CPC .... *H03F 2200/09* (2013.01); *H03F 2200/315* (2013.01); *H03F 2200/451* (2013.01); *H03F 2200/541* (2013.01)
(58) Field of Classification Search
  CPC ......... H03F 2200/315; H03F 2200/451; H03F 2200/541; H03F 2200/432; H03F 2200/516; H03F 2200/522; H03F 2200/75; H03F 3/607; H03F 1/0261; H03F 1/0288; H03F 3/193; H03F 3/301; H03F 3/45183
  USPC .............................. 330/277, 295, 124 R, 286
  See application file for complete search history.

(56) References Cited

U.S. PATENT DOCUMENTS

| | | | |
|---|---|---|---|
| 9,172,340 B2 | 10/2015 | Satomi | |
| 2006/0006949 A1* | 1/2006 | Burns | H03F 3/45475 330/301 |
| 2006/0108664 A1 | 5/2006 | Samelis | |
| 2006/0279360 A1* | 12/2006 | Shigematsu | H03F 3/3022 330/286 |
| 2010/0176885 A1 | 7/2010 | Kim et al. | |
| 2014/0184339 A1 | 7/2014 | Gomez et al. | |
| 2015/0256129 A1* | 9/2015 | Sato | H03F 3/605 330/277 |
| 2016/0261237 A1 | 9/2016 | Sato et al. | |
| 2018/0062589 A1* | 3/2018 | Bazzani | H03F 1/56 |

FOREIGN PATENT DOCUMENTS

| | | |
|---|---|---|
| JP | H03201709 A | 9/1991 |
| JP | H06260858 A | 9/1994 |
| JP | H0715253 A | 1/1995 |
| JP | 2000261262 A | 9/2000 |
| JP | 2004235797 A | 8/2004 |
| JP | 2011066599 A | 3/2011 |
| JP | 2014045337 A | 3/2014 |
| JP | 2016165085 A | 9/2016 |
| WO | 2012076924 A1 | 6/2012 |
| WO | 2016056952 A1 | 4/2016 |
| WO | 2016182485 A1 | 11/2016 |
| WO | 2016199178 A1 | 12/2016 |

OTHER PUBLICATIONS

International Preliminary Report on Patentability, issued in corresponding International Application No. PCT/SE2017/050342, dated Jun. 27, 2019, 22 pages.
Fisher, S. T., "A New Method of Amplifying with High Efficiency a Carrier Wave Modulated in Amplitude by a Voice Wave" Proceedings of the I.R.E, 1946, 11 pages.
Doherty, W. H., "A New High Efficiency Power Amplifier for Modulated Waves" Proceedings of the Institute of Radio Engineers, vol. 24, No. 9, Sep. 1956, pp. 1163-1182.

* cited by examiner

WIDEBAND POWER AMPLIFIER ARRANGEMENT

CROSS REFERENCE TO RELATED APPLICATION(S)

This application is a 35 U.S.C. § 371 National Phase Entry Application from PCT/SE2017/050342, filed Apr. 6, 2017, designating the United States, the disclosure of which is incorporated herein by reference in its entirety.

TECHNICAL FIELD

Embodiments herein relate to a power amplifier arrangement for amplification of an input signal into an output signal. In particular, they relate to a wideband power amplifier arrangement comprising a plurality of amplifier sections distributed along an input transmission line and an output transmission line, and an electronic device comprising the power amplifier arrangement.

BACKGROUND

Power amplifiers are widely used for example in radio base stations and user equipment in wireless communication systems. Radio Frequency (RF) power amplifiers typically amplify an input signal of high frequency into an output signal ready for radio transmission. High efficiency is generally desirable for RF power amplifier design to reduce the amount of power consumed.

To get high efficiency in RF power amplifiers, voltages drop over transistors in the power amplifiers need to be low when currents through the transistors are high, and vice versa. This may be achieved by making either a current waveform or voltage waveform, or both, have a prolonged and flattened shape near zero at right places in each RF signal cycle. This waveform shaping is often accomplished by having resonators in an output circuit that force certain harmonics to be present or absent in the waveform at an output node of the transistor in the power amplifier.

RF Amplifiers with high waveform efficiency are designated as having a certain class depending on what waveforms are used. For example, class B uses a half-wave rectified current waveform obtained from a sinusoidal input signal while keeping voltage waveform sinusoidal through a use of a resonator circuit that shorts out all higher harmonics signals but allows the fundamental signal. The flattened low-current part coincides with the high voltage part during each RF signal cycle, which improves efficiency compared to having both waveforms sinusoidal. Class F uses the same shape for current waveform as class B but forces the voltage to contain odd harmonics through a more complicated resonator. The voltage waveform then gets flatter at the bottom compared to class B which reduces power loss during the high-current part of the signal cycle.

These resonant classes of amplifiers are typically narrowband since they rely on resonant circuits to shape signal waves and make the output signal sinusoidal. Using larger number of harmonics reduces bandwidth of the fundamental frequency signal since the harmonic signal bands overlap the fundamental signal band, which makes it impossible to use different impedances for them. The resonators also add losses that decrease efficiency. Furthermore, parasitic such as output capacitance of the transistor also reduces bandwidth.

Generally, an RF power amplifier can be driven in a so called backed off operation. This means that the power amplifier is operated at a certain level, e.g. expressed as a number of decibels (dBs), under its maximum output power or amplitude. The Doherty amplifier discussed in W. H. Doherty, "*A new high efficiency power amplifier for modulated waves,*" Proc. IRE, vol. 24, no. 9, pp. 1163-1182, September 1936, has better efficiency at backed off operation than a simple one-transistor amplifier since it splits the amplifier transistors in two parts, wherein one amplifier transistor is used at low amplitudes, and both are used at high amplitudes. The one that is used at low amplitudes sees a higher load resistance, which means that RF current used for achieving a certain output power is lower. At intermediate amplitudes the two amplifier transistors need to interact in a way that is often described as one amplifier transistor modulating the load resistance to the other. The Direct Current (DC) consumption is thereby lowered since it is largely proportional to the RF current. The arrangement for seamlessly achieving this split functionality consists of an impedance-inverting circuit, usually a quarter wavelength transmission line or equivalent, which has a consequence of making the amplifier narrowband with respect to increased efficiency.

Two ways of splitting up a waveform in a number of pieces or portions horizontally or vertically so that the individual pieces can be amplified with higher efficiency was described by S. T. Fisher in "*A New Method of Amplifying with High Efficiency a Carrier Wave Modulated in Amplitude by a Voice Wave*", Proc. IRE, January 1946. An implementation is provided for "vertical slicing" signal, i.e. dividing the input signal vertically on a time basis into non-overlapping pulses and amplifying them with different amplifier tubes depending on their height, i.e. pulses local amplitudes. A problem with this is that the vertically sliced signal parts or sections need very fast transitions in the amplifier tubes from on to off in order not to overlap too much, which otherwise reduces efficiency. Each amplifier tube also needs to reach target output amplitude within a short time available. Another problem is that most of the sub-amplifiers must individually be able to output a large part of the maximum power. This means that the transistor cost is considerably higher than for a conventional amplifier.

Although splitting up a waveform in a number of pieces or portions horizontally, i.e. dividing the input signal on an amplitude basis into signal portions with smaller amplitude span is discussed, there is no implementation provided for amplifying such "horizontal slicing" signals with high efficiency.

SUMMARY

Therefore, an object of embodiments herein is to provide a power amplifier arrangement with improved efficiency and bandwidth.

According to an aspect, the object is achieved by a power amplifier arrangement for amplifying an input signal to produce an output signal. The power amplifier arrangement comprises a plurality N of amplifier sections, wherein N=2, 3, . . . . The power amplifier arrangement further comprises a first input transmission line comprising multiple segments and a first output transmission line comprising multiple segments. Each amplifier section comprises one or more first transistors distributed along the first input transmission line and the first output transmission line such that gates of the one or more first transistors are connected to respective segments of the first input transmission line, drains of the one or more first transistors are connected to respective segments of the first output transmission line. Each amplifier section is configured to amplify a portion of the input signal to produce a portion of the output signal. A portion of the input signal is one of N portions of the input signal partitioned on any one or a combination of an amplitude basis and a time basis. The output signal is produced at an end of the first output transmission line by building up N potions of the output signal from each amplifier section.

In other words, the power amplifier arrangement according to some embodiments herein uses successive wideband amplifier sections that each amplify a portion of the input signal and adds amplified signal portions to the output signal. The input signal may be sliced horizontally. This means that each portion of the input signal is "flat-topped" with relatively short transition time between its maximum and minimum amplitudes and therefore may mostly be amplified with high waveform efficiency. Since the flat-topped signal parts approach "square-wave" shape if many such portions are used, the waveform efficiency can therefore be substantially higher than for a class B amplification in prior art. The efficiency of each amplifying section increases with output signal amplitudes above its maximum level since the waveforms generally gets more square-wave like as the amplitude increases. Therefore, the power amplifier arrangement according to some embodiments herein provides a way to achieve and amplify input signals with a Fisher-type horizontal division in amplitude and have flat-top waveforms for both voltage and current within each amplifying section.

The output signal is built or reassembled from the output signal parts that may be individually produced with very high waveform efficiency. No resonators or filters are necessary and impedance levels can therefore be uniform over a desired frequency band. The frequency components of the sliced input signal have the same scale within each amplifying section, which means that different harmonics from different frequency parts of the input signal can overlap without consequence. The high efficiency operation can therefore have very large relative bandwidth. Barring imperfections in the implementation, the final reassembled output signal may be "clean" and no need of filtering.

Therefore the power amplifier arrangement according to embodiments herein has improved performance with high waveform efficiency combined with high backed off operation efficiency within large bandwidths, with minimal transistor cost for arbitrary input signals.

BRIEF DESCRIPTION OF THE DRAWINGS

The various aspects of embodiments disclosed herein, including particular features and advantages thereof, will be readily understood from the following detailed description and the accompanying drawings, in which.

DETAILED DESCRIPTION

Throughout the following description similar reference numerals have been used to denote similar features, such as elements, units, modules, circuits, nodes, parts, items or the like, when applicable.

As part of developing embodiments herein, two ways of splitting up a signal waveform into a number of pieces or portions horizontally or vertically will first be discussed.

FIG. 1a illustrates a division of a sinusoidal wave into a number of portions horizontally, i.e. on an amplitude basis. Subdivision of the signal waveform into portions in a way that each portion approximates an optimum, rectangular waveform, i.e. approaches a square-topped wave as nearly as possible.

FIG. 1b illustrates a division of a sinusoidal wave into a number of portions vertically, i.e. on a time basis. The signal waveform is divided or sliced into a series of pulses, each of which has a form more nearly approaching the required rectangular form.

These two ways of splitting up a signal waveform may be applied to any modulated signal with any waveform. The signal waveform may also be divided on a combination of amplitude basis and time basis. For example, a portion of the signal divided on the amplitude basis may be further divided on a time basis, or vice versa.

The portions of the signal waveform can be amplified separately in an amplifier arrangement with high efficiency and recombined to produce an output signal with the original signal waveform at higher power.

Figure 2:
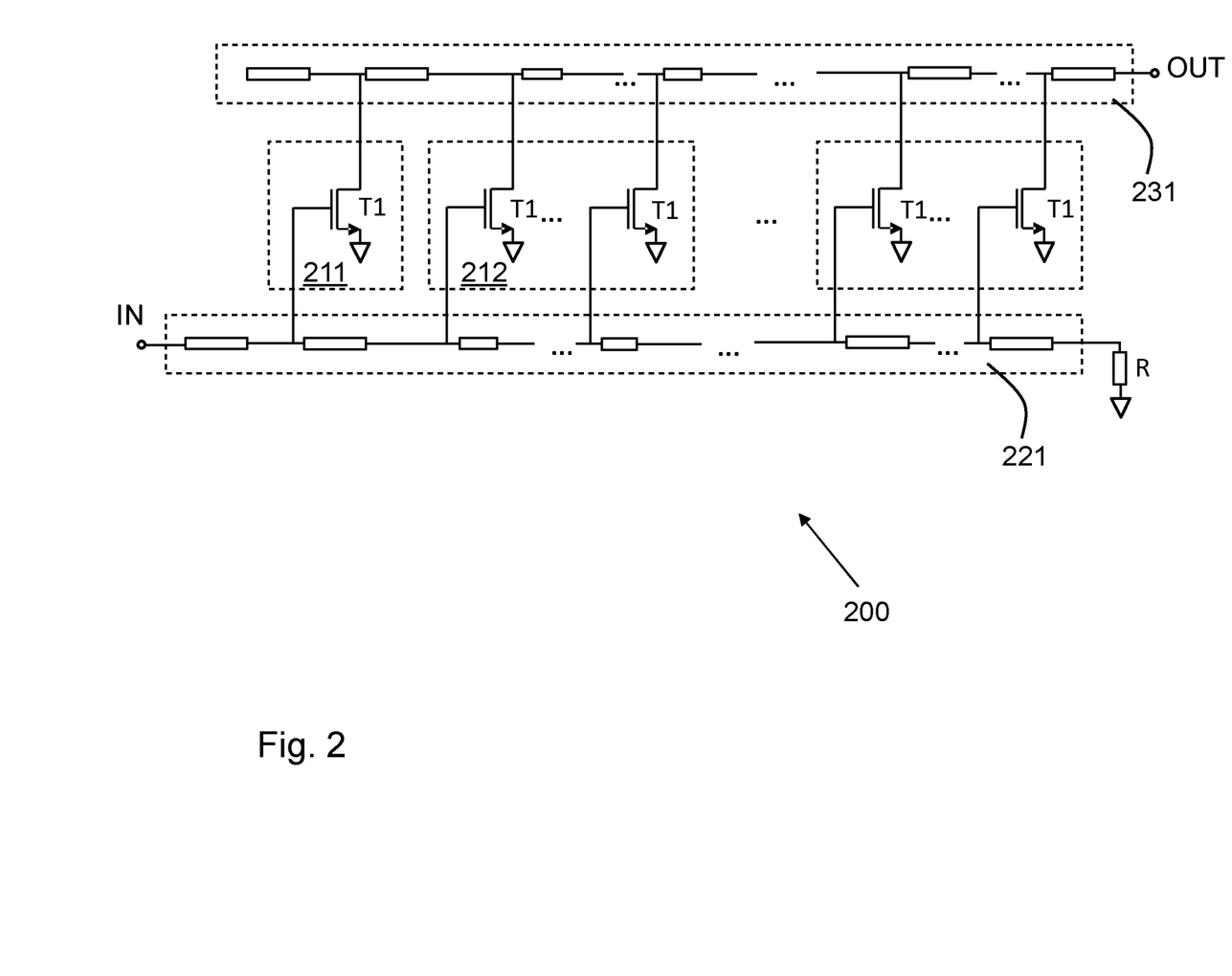
FIG. 2 is a schematic block diagram illustrating a power amplifier arrangement according to embodiments herein.

FIG. 2 illustrate such a power amplifier arrangement 200 according to embodiments herein for amplifying an input signal to produce an output signal with high efficiency. The power amplifier arrangement 200 comprises a plurality N of amplifier sections 211, 212, . . . , wherein N=2, 3, . . . .

The power amplifier arrangement 200 further comprises a first input transmission line 221 comprising multiple segments and a first output transmission line 231 comprising multiple segments.

Each amplifier section 211, 212, . . . comprises one or more first transistors T1 distributed along the first input transmission line 221 and the first output transmission line 231 such that gates of the one or more first transistors T1 are connected to respective segments of the first input transmission line 221, drains of the one or more first transistors T1 are connected to respective segments of the first output transmission line 231.

Each amplifier section 211, 212, . . . is configured to amplify a portion of the input signal IN to produce a portion of the output signal. The output signal OUT is produced at an end of the first output transmission line 221 by building up N potions of the output signal from each amplifier section 211, 212 . . . .

As discussed above, a portion of the input signal may be one of N portions of the input signal partitioned on an amplitude basis, or on a time basis, or on a combination of amplitude basis and time basis.

That is to say, high-efficiency amplification is achieved by dividing the input signal wave, e.g. on an amplitude basis, into a number of N potions, e.g. N=3, amplifying each of the input signal portions through a power amplifier section and then combining the outputs of the number of amplifier sections at the first output transmission line 231 so that an output signal at higher power with the original signal waveform at the end of the first output transmission line is again obtained.

According to some embodiments herein, the N portions of the input signal may be partitioned by digital or analogue shaping circuits before inputting to each amplifier section. That is the N portions of the input signal may be pre-shaped in advance. The pre-shaped signals make amplifier gain higher since drive signal amplitude may be lower for a similar output.

It is also possible to do the N portions partition wholly or partly at the amplifying transistors themselves on an amplitude base. For example, the turn-on characteristic of a transistor may be used for de-selecting the bottom part of the input signal waveform, and voltage saturation of a transistor naturally limits the upward voltage excursions due to current self-regulation within the transistor.

Therefore, according to some embodiments herein, the N portions of the input signal may be partitioned on an amplitude basis by the N amplifier sections. Each amplifier section may be configured to amplify a portion of the input signal to produce a portion of the output signal depending on amplitudes of each portion of the input signal.

It is also possible to do the N portions partition wholly or partly at the amplifying transistors themselves on a time basis into a series of pulses. For example, each of the amplifier sections may have its gate drive and gate bias individually adjusted so that it conducts current at a time in sequence and not simultaneously, which has the same effect as inputting a signal with a series of pulses.

Therefore, according to some embodiments herein, the N portions of the input signal may be partitioned on a time basis into a series of pulses by the N amplifier sections. Each amplifier section may be configured to amplify a portion of the input signal to produce a portion of the output signal depending on times of each portion of the input signal.

As shown in FIG. 2, the feeding of the transistors in each amplifier section is often done by transmission lines that run along the gates of the transistors with essentially the same impedance throughout and then terminated in a resistance R. So, according to some embodiments herein, each segment of the first input transmission line 221 may have uniform impedance.

For the power amplifier arrangement 200 to work well, there are a few requirements on the amplifier sections 211, 212 . . . . First, it is necessary for a few harmonics to pass from section to section, and do this at the same speed and scale as the fundamental. That is there should be wide enough bandwidth and low enough dispersion for the "sliced" signal portion to retain most of its shape through the subsequent processing. This may be achieved by designing the transforming lines, e.g. the first output transmission line 231, with shorter segments. Further, irregular transmission line segment lengths or non-equal transmission line segment length may be used to make a pseudo high-pass response that is good enough for the harmonics without using an excessive number of segments. The lengths of the output transmission line segments are generally longer at the beginning and end regions of the first output transmission line 231.

Therefore, according to some embodiments herein, the lengths of the first output transmission line segments may be non-equal.

The amplifier structure shown in FIG. 2 is a single-ended structure. The output is recovered by filtering away the harmonics. This type of implementation has 16% efficiency penalty for a sinusoidal signal. It can only be used within a smaller bandwidth since the harmonics cannot be filtered by a static filter if they fall within the possible band of the fundamental signal. The bandwidth for the filtered single-ended version is thus typically less than an octave due to the filtering of the second harmonic.

Figure 3:
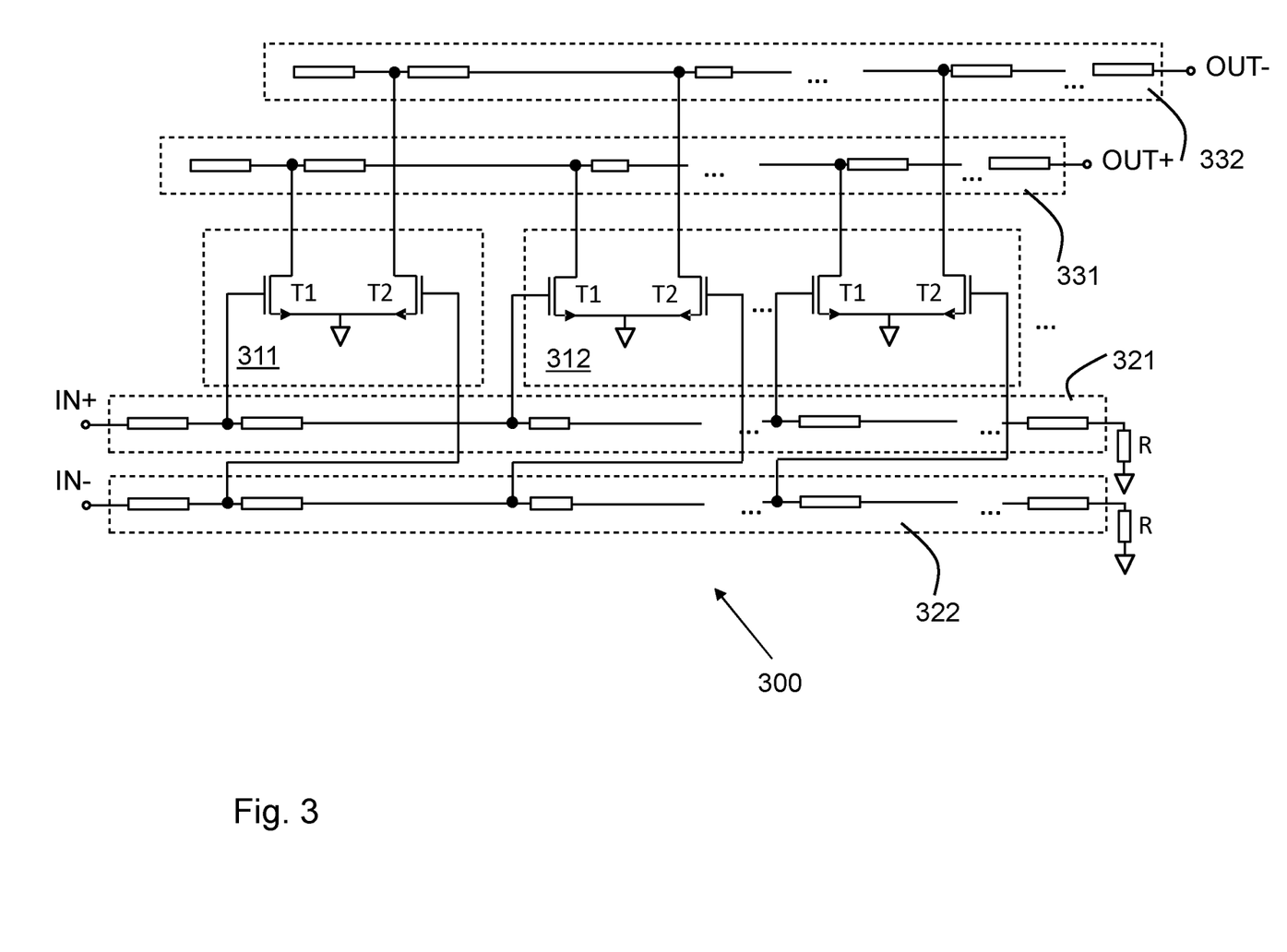
FIG. 3 is a schematic block diagram illustrating a power amplifier arrangement according to embodiments herein.

FIG. 3 shows a power amplifier arrangement 300 with a differential structure for amplifying a differential input signal with positive and negative signals.

As shown in FIG. 3, the power amplifier arrangement 300 comprises a plurality N of amplifier sections 311, 312. In addition to the one or more first transistors T1, each amplifier section 311, 312 . . . further comprises one or more second transistors T2. The one or more second transistors T2 may be the same type as the respective one or more first transistors T1 and may be push-pull coupled with the respective first transistors T1 by connecting in differential with the respective one or more first transistors T1.

In addition to a first input transmission line 321 and a first output transmission line 331, the power amplifier arrangement 300 further comprises a second input transmission line 322 comprising multiple segments and a second output transmission line 332 comprising multiple segments. Gates of the one or more second transistors T2 are connected to respective segments of the second input transmission line 322, drains of the one or more second transistors T2 are connected to respective segments of the second output transmission line 332.

The positive and negative input signals IN+, IN− may be obtained in a wideband unbalanced-to-balanced transformer. The portions of positive input signal may be applied at the first input transmission line 321 and the portions of negative input signal may be applied at the second input transmission line 322.

To feed Direct Current (DC) to the two differentially connected transistors T1, T2, the power amplifier arrangement 300 may further comprise a negatively coupled inductor pair or a center-tapped inductor (not shown).

Each amplifier section 311, 312 . . . are configured to amplify a portion of positive input signal to produce a portion of positive output signal at the first output transmission line 331 and amplify a portion of negative input signal to produce a portion of negative output signal at the second output transmission line 332.

The power amplifier arrangement 300 may further comprise a wideband coupler, or a wideband 180-degree coupler, or a balun or balanced-to-unbalanced transformer (not shown) to combine positive and negative output signals OUT+, OUT− from the first and second output transmission lines 331, 332.

Figure 4:
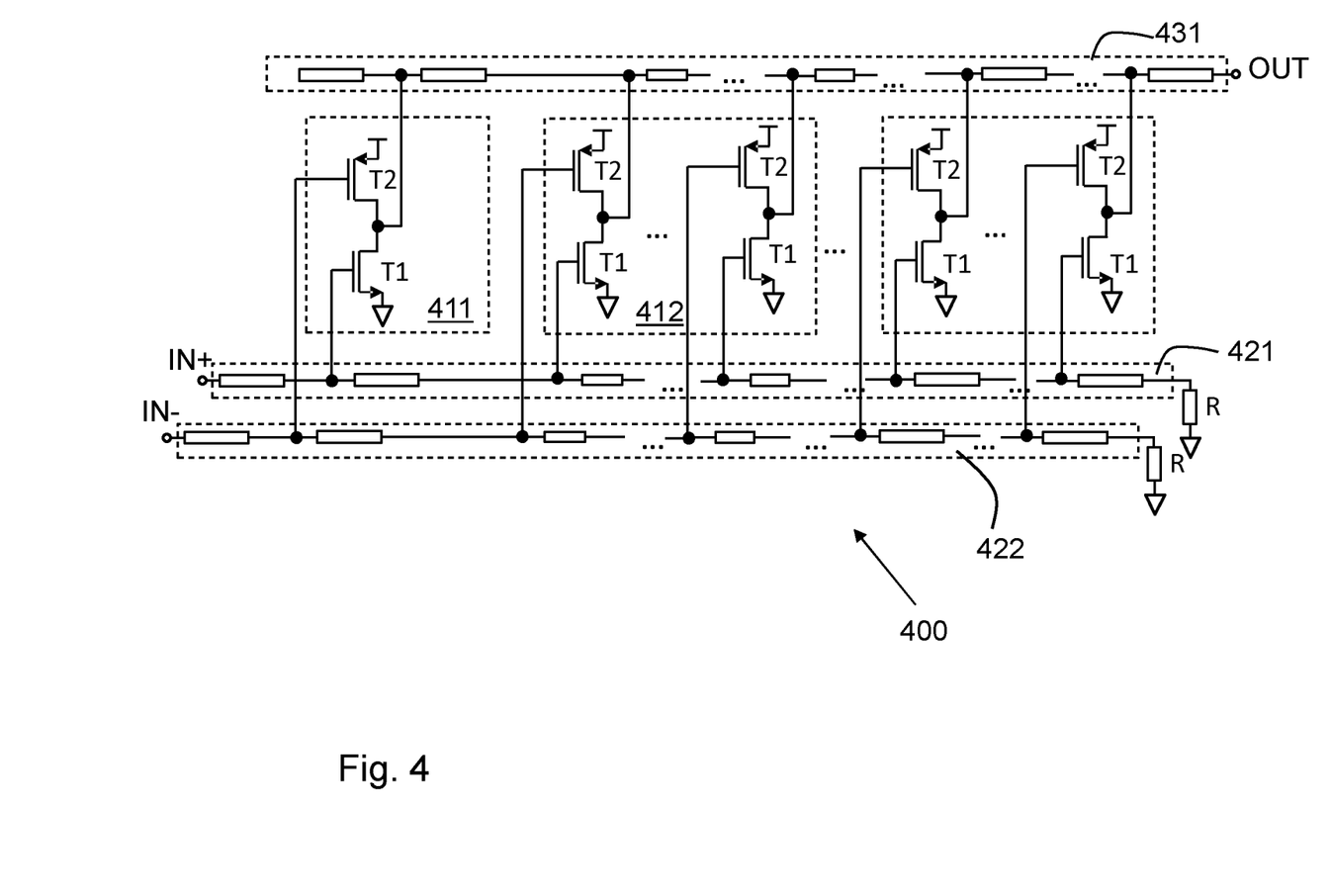
FIG. 4 is a schematic block diagram illustrating a power amplifier arrangement according to embodiments herein.

FIG. 4 shows another example power amplifier arrangement 400 for amplifying a differential input signal with positive and negative signals according to some embodiments herein. As in the power amplifier arrangement 300 shown in FIG. 3, each amplifier section 411, 412 . . . further comprises one or more second transistors T2. The one or more second transistors T2 may be stacked with the respective one or more first transistors T1, i.e. the respective first and second transistors T1, T2 are push-pull coupled. When push-pull coupled is achieved by stacking transistors of different type e.g. P-channel and N-channel FETs, only one output transmission line is typically used, and no combiner is necessary.

So, in this embodiment, in addition to a first input transmission line 421, the power amplifier arrangement 400 may further comprise a second input transmission line 422 comprising multiple segments, and gates of the one or more second transistors T2 are connected to respective segments of the second input transmission line 422, drains of the one or more second transistors are connected to respective segments of a first output transmission line 431.

Each amplifier section 411, 412, . . . is configured to amplify a portion of positive input signal and a portion of negative input signal to produce a portion of positive output signal and a portion of negative output signal at the first output transmission line 431.

The push-pull coupled arrangement is one of the arrangements that give the highest theoretical efficiency since no unnecessary signal power is produced.

According to some embodiments herein, the one or more second transistors T2 may be the same type as the respective one or more first transistors T1 and may produce the positive or negative part of the output signal independently. That is the one or more second transistors T2 are not coupled with the respective one or more first transistors T1. The two outputs will then be independent "half-signals" in both voltage and current, and may be reassembled in a wideband coupler that discards the common-mode parts of the signals and outputs the differential part. The theoretical asymptotic efficiency for generating the "half-signal" is 100%, but this signal contains unnecessary signal that also has some power. The efficiency is lowered by about 16% for a sinusoidal signal, compared to the push-pull coupled arrangement, due to the discarding of the unnecessary common-mode component.

Figure 5:
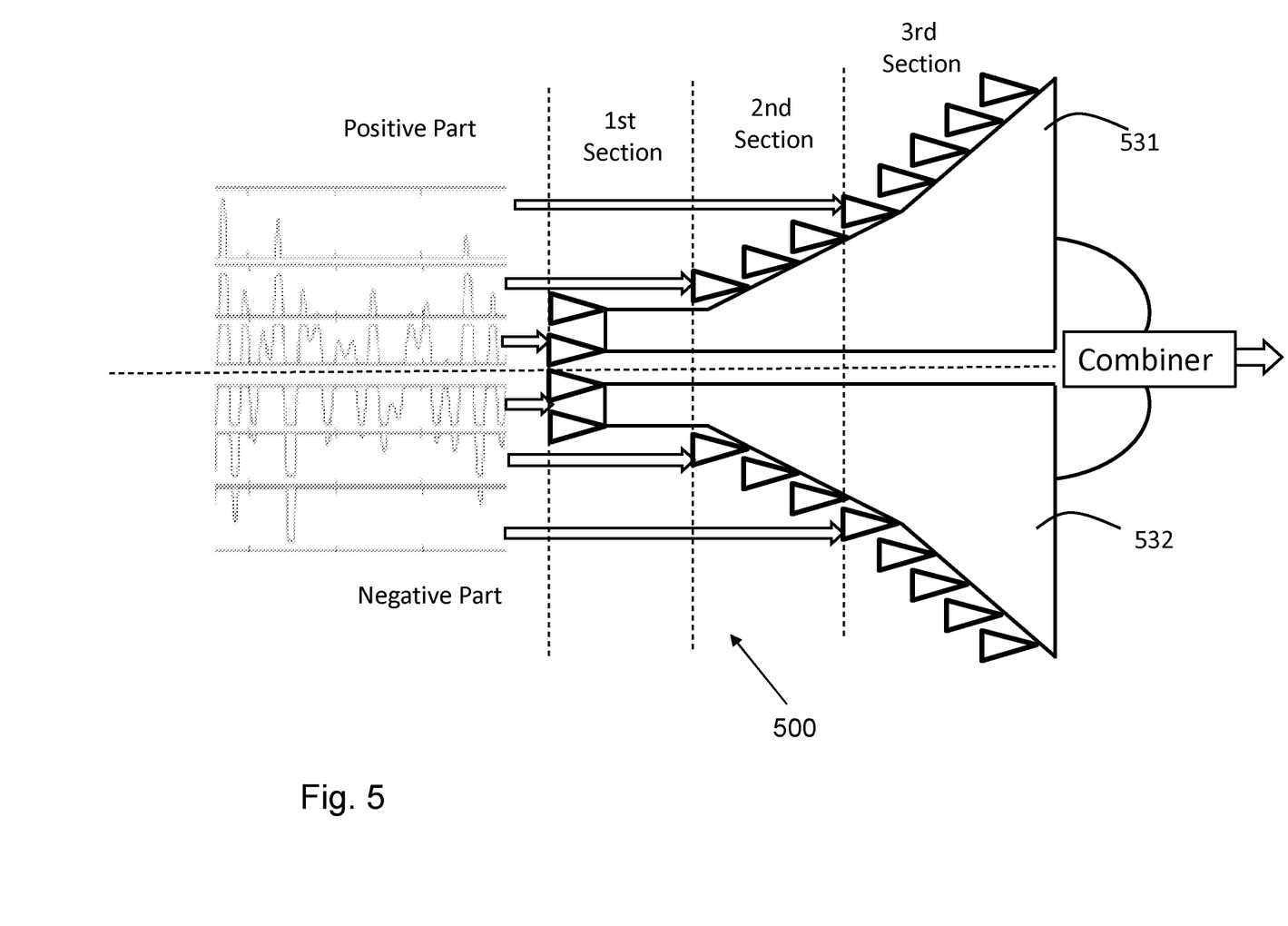
FIG. 5 is a sketch illustrating an example of input signal portions and distributed power amplifier sections according to embodiments herein.

FIG. 5 is a sketch illustrating such an amplifier arrangement comprising positive and negative sections which may produce positive and negative part of the output signal independently. Examples of pre-shaped portions of positive and negative input signals are also shown. As shown in FIG. 5, the input signal may be divided into, e.g. three positive and three negative parts, which are each fed to an amplifier section comprising one or several transistors, shown as small triangle symbols. The subsequent sections generally need several amplifier transistors distributed along a transforming transmission line section shown as a trapezoid shape 531, 532. In this way, the maximum voltage amplitudes of all sections can be held at the same level, and a common supply voltage may be used.

Figure 6:
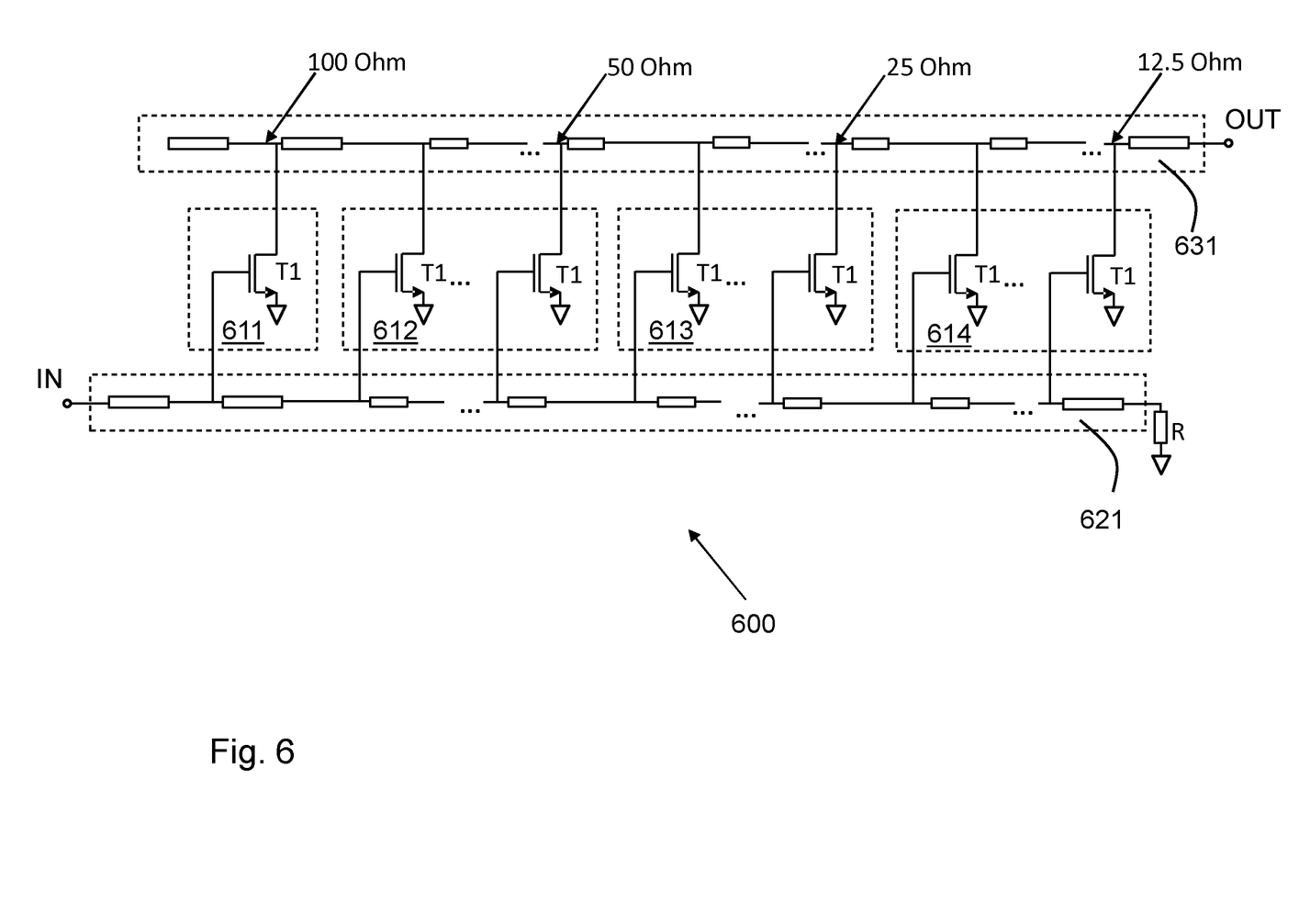
FIG. 6 is a schematic block diagram illustrating an example of a power amplifier arrangement according to embodiments herein.
Figure 7:
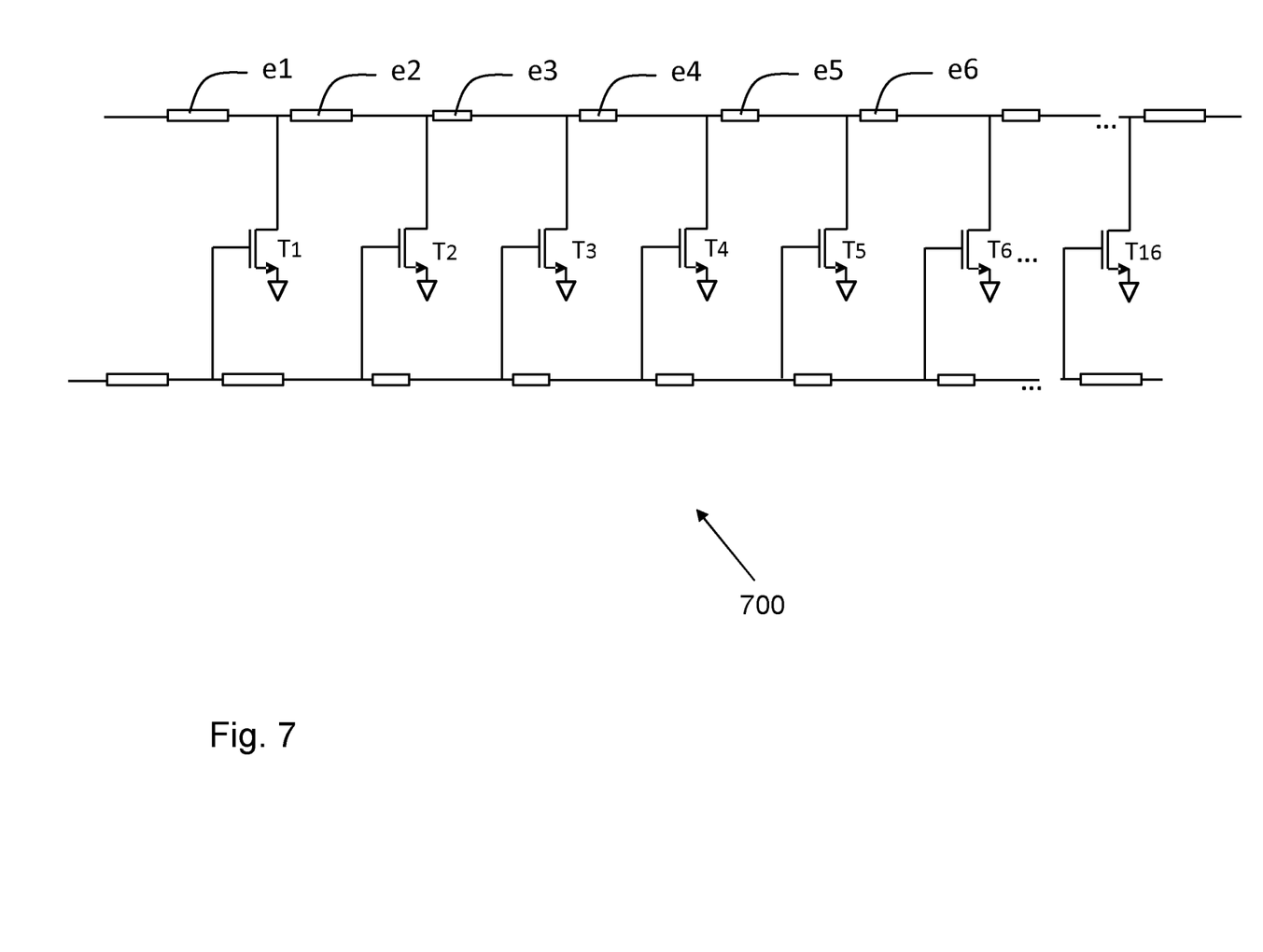
FIG. 7 is a schematic block diagram illustrating one example of a power amplifier section according to embodiments herein.

FIG. 6 shows an example of a power amplifier arrangement 600 comprising 4 amplifier sections 611, 612, 613, 614. As shown in FIG. 6, the first amplifier section 611 comprises a first transistor connected to the start of input and output transmission lines 621, 631. The characteristic impedance of the output transmission line 631 at this point may be e.g. 100 Ohm depending on the load impedance to the power amplifier arrangement and how many amplifier sections are implemented. The subsequent section, e.g. a second amplifier section 612, may have 16 equal size transistors distributed along a transforming transmission line section, i.e. a part of the output transmission line 631, which may end at a characteristic impedance of e.g. 50 Ohm. The total output power of these 16 transistors may be the same as the output power of the first transistor. The circuit schematic of the transforming transmission line section 700 with 16 segments and distributed 16 transistors is shown in FIG. 7. The total electrical length of the transforming transmission line section with 16 segments may be 0.54 wavelengths at a low cutoff frequency and the frequency span may be designed to be 10:1 for the fundamental frequency. The lengths of the transmission line segments are generally longer in the beginning and end regions in the transforming transmission line section 700 of the output transmission line. The admittance of the output transmission line segments may increase by 1/16, i.e 1/1600 Siemens for each segment, starting at 1/100 Siemens and ending at 1/50 Siemens. The input transmission line may be of uniform impedance. The electrical lengths in degrees for the 16 segments at the center frequency, e.g. 5.5, if the span is 10:1, may be, e.g. e1=43.2, e2=89.3, e3=88.1, e4=84.3, e5=77.2, e6=60.3, e7=61.0, e8=59.9, e9=51.0, e10=48.3, e11=55.4, e12=58.6, e13=56.0, e14=73.8, e15=77.5, e16=84.9.

The next amplifier section, i.e. the $3^{rd}$ section 613 may look like the one just described, but may be scaled up about a factor of two in power. The transistors in this amplifier section may be twice as big or twice as many as those in the previous section. For the same supply voltage, this means that the total output transmission line impedance for this section is half of the value of the ones just described. The output transmission line impedances for this amplifier section thus may start at 50 Ohm and end at 25 Ohm. Another way to achieve the same is to connect two amplifier sections of the same size as in the previous section side by side. The next amplifier section, i.e. the $4^{th}$ section 614 may again be scaled up by a factor of two, so that it is four times as big in transistor power as the first section and has half the drain line impedances of the preceding one, i.e. starting at 25 Ohm and ending at 12.5 Ohm.

Figure 8:
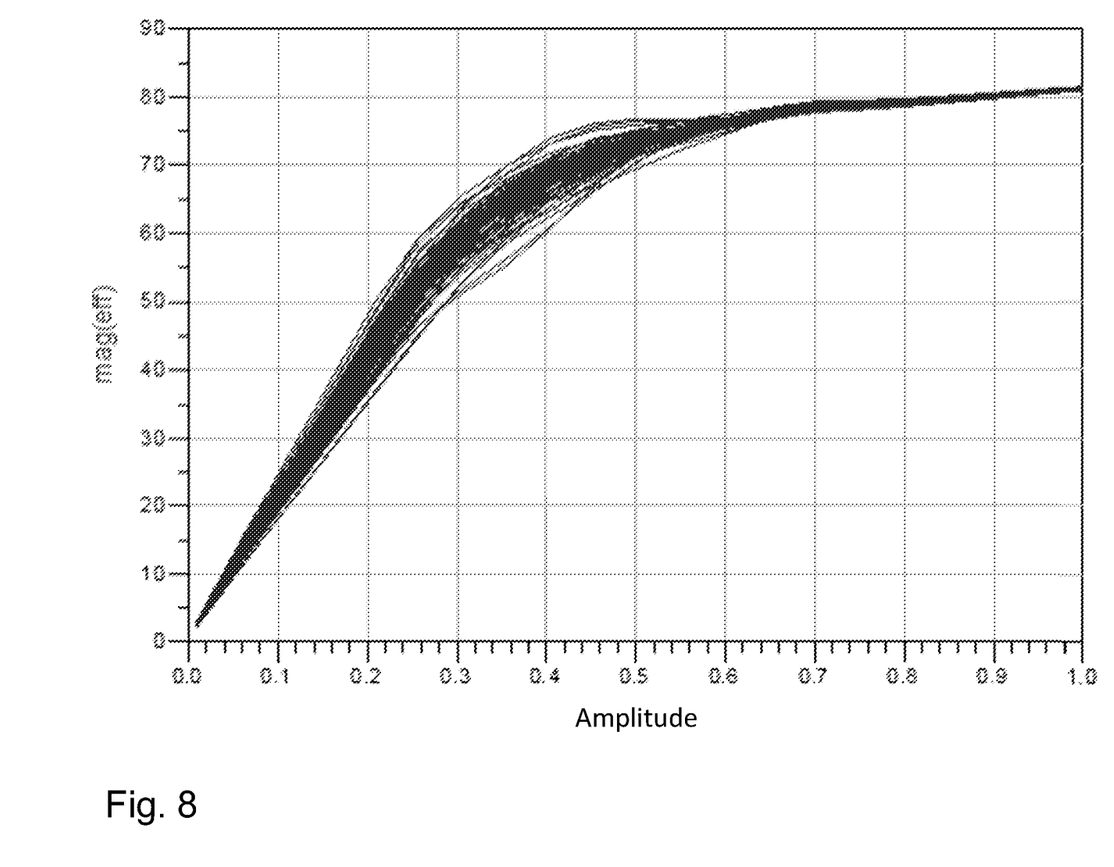
FIG. 8 is a diagram illustrating efficiency curves of a power amplifier arrangement according to embodiments herein.

To illustrate features and advantages of the power amplifier arrangement 600 according to embodiments herein, a collection of efficiency curves taken over the 10:1 frequency span versus signal amplitude are shown in FIG. 8. The efficiency varies more at low amplitudes since the transistors and sections active at low amplitudes get accumulated transformation imperfections of all the subsequent sections. Note however that the frequency span is very wide at 10:1, several harmonics are involved and there are only 16 equal admittance steps in each section. The ripple in efficiency can easily be smaller, and the average efficiency thus higher, in less extreme bandwidths and with more and smaller admittance steps in each section.

Figure 1:
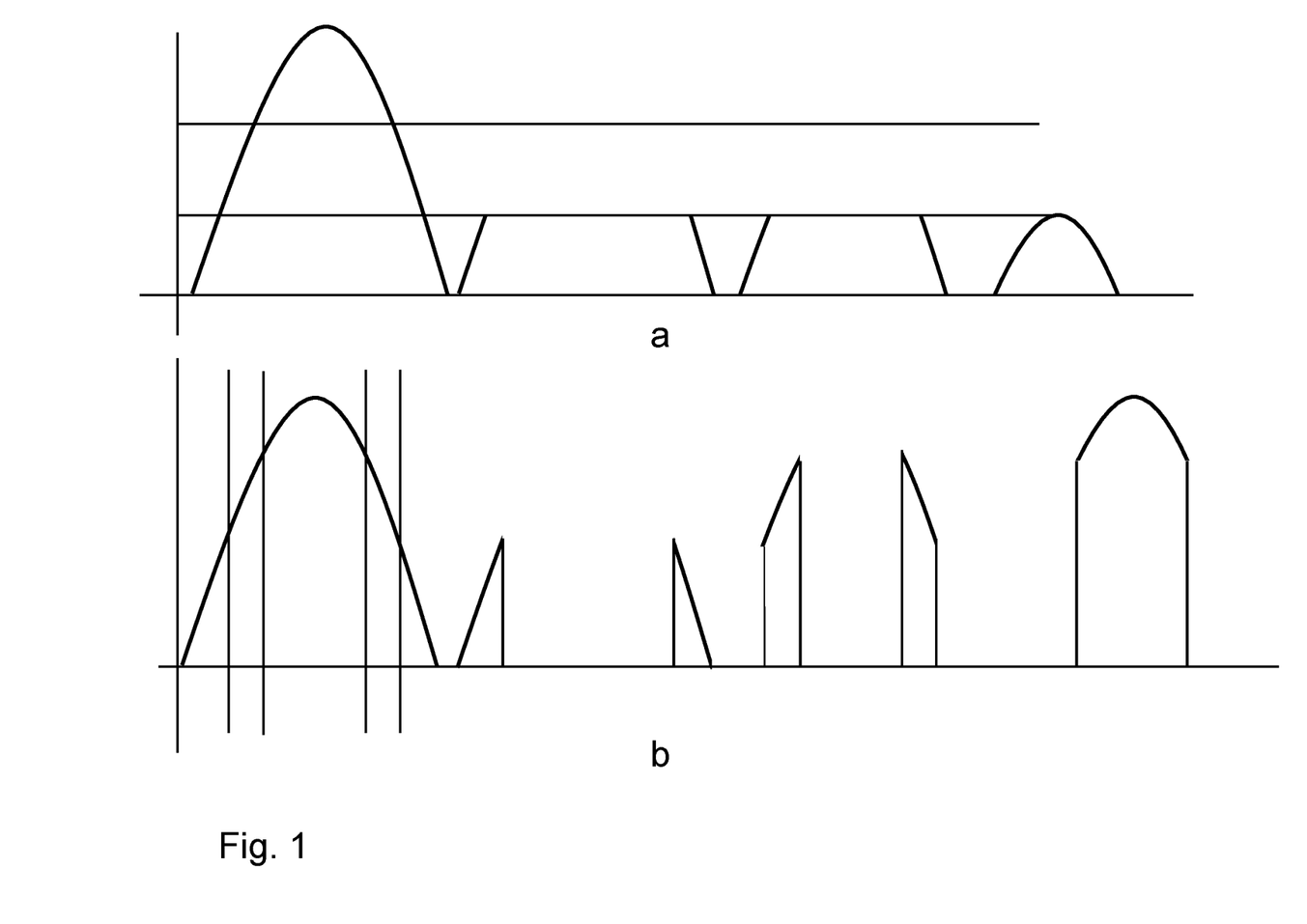
FIGS. 1a and 1b are diagrams illustrating division of a signal wave into portions horizontally and vertically.

In this example, emphasis is on the implementation of "horizontal" signal division, since this is perceived to have large benefits over the "vertical" division. The wideband amplifier sections in the power amplifier arrangement 200, 300, 400, 600 each adds a "horizontally sliced" signal part to the output signal. This means that the voltages and currents are "flat-topped" with relatively short transition times between maximum and minimum and therefore mostly amplified with high waveform efficiency. The flat-topped signal parts approach "square-wave" shape if many such sections are used. However, the power amplifier arrangement 200, 300, 400, 600 according to embodiments herein may, with modifications, be used also for the vertical signal division. This is because the vertical signal division, unlike in regular switching amplifiers, is done based on the local waveform amplitude. As shown in FIG. 1, in the horizontally sliced signal case, the signal portions stay at its top levels when they reach them and until the signal voltage passes in the other direction, whereas in the vertically sliced ones, the signal portions return to zero at these points. So the vertically divided signal has more off- and on-transitions.

These vertical signal transitions are steep, and therefore hard to do without power loss. The voltage range in the horizontally divided signal case is divided into parts, each part has lower amplitude than the total voltage range. In the vertically divided signal case, each part has different amplitude and is increasing and the amplifier sections must each provide the full power of the subdivision's top amplitude. If it is assumed that the amplitude divisions are equal, the power added from each amplifier section in the horizontal division case is the difference between the squares of the amplitudes. So in a power amplifier arrangement with three amplifier sections, the total power becomes 1+4+9=14 for the vertically division case, and 1+3+5=9 for the horizontal division case. For a power amplifier arrangement with four amplifier sections, the total power becomes 1+4+9+16=30 for the vertical division, and 1+3+5+7=16 for the horizontal division. So the total power for amplifying the vertically divided signal may be twice as much as the total power for amplifying the horizontally divided signal in the power amplifier arrangement with four amplifier sections. This problem may get worse with finer signal divisions to get high efficiency, since more transistor power and more on/off transitions per unit of time will be needed. However, a benefit over traditional vertical signal Fisher amplifiers is that overlap between signal pulses from different amplifier sections is not a problem. This means that the rising and falling flanks of the signal pulses can overlap without simultaneous conduction of the two stacked transistors. Other signal divisions are also possible, for example combinations of vertical and horizontal division. Therefore, Fisher-type horizontal or vertical signal division, or a combination of vertical and horizontal signal division is made possible through specially designed and driven wideband amplifier sections in the power amplifier arrangement 200, 300, 400, 600.

Figure 9:
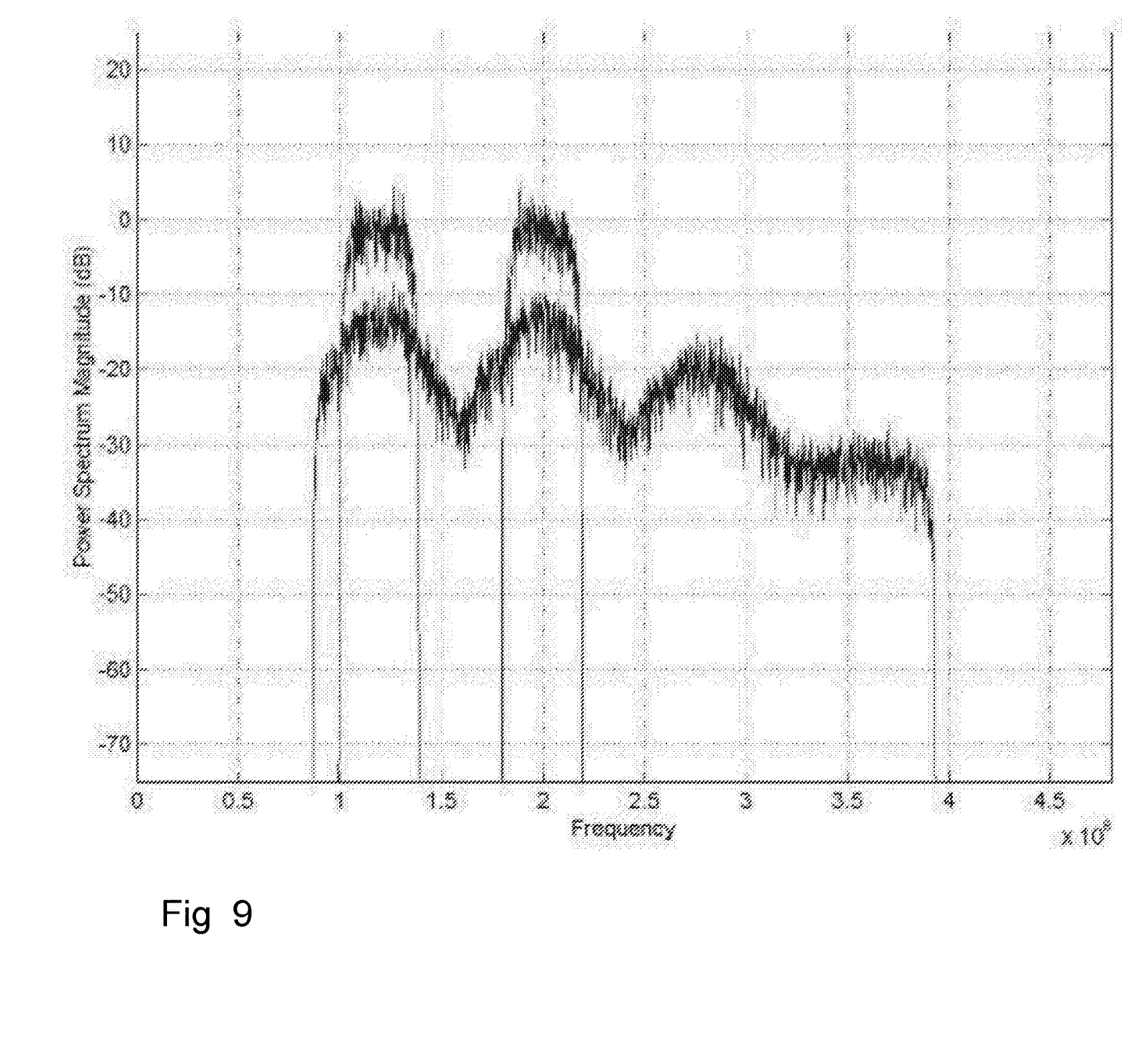
FIG. 9 is a diagram illustrating examples of input signal shapes.

The power amplifier arrangement 200, 300, 400, 600 according to embodiments herein works well if a "sufficient" number of harmonics can be produced and carried between amplifier sections, and likewise there needs to be sufficient response for intermodulation products of wideband and multiband signals. In other words, the shape of the "sliced" signal portion should remain as intact as possible through the subsequent processing. Ripple, nonlinearity of the output signal and lowered efficiency may result in case the frequency responses of the amplifier sections are insufficient. Some of these problems may be counteracted by pre-processing the partial signals by nonlinear filtering instead of having static amplitude functions. This technique can be useful for example if portions of the intermodulation sidebands cannot be amplified or transported between amplifier sections efficiently. This type of shaped signal spectrum, useful for example for avoiding bad response in the low frequency range, is illustrated in FIG. 9. As shown in FIG. 9, the spectrum shape is asymmetric. There is less low frequency sidebands present since they are filtered out, while the time-domain shape is preserved as optimally as possible, i.e. without overshoots since the filter is nonlinear.

The wideband amplification sections may be designed to send most of their output signals towards the output, which ensures low ripple voltage and therefore low worst case power loss in the transistors. The output signal is built from parts that are individually produced with very high waveform efficiency. No resonators or filters are necessary and impedance levels can therefore be uniform over a desired frequency band. The frequency components of the sliced input signal have the same scale within each amplifying section, which means that different harmonics from different frequency parts of the input signal can overlap without consequence. The high efficiency operation can therefore have very large relative bandwidth. Barring imperfections in the implementation, the final reassembled output signal may be "clean" and no need of filtering.

To summarize above discussions, the amplifier power amplifier arrangement 200, 300, 400, 600 may achieve high waveform efficiency combined with high backed off operation efficiency within large bandwidths, and with minimal transistor cost for arbitrary input signals.

Figure 10:
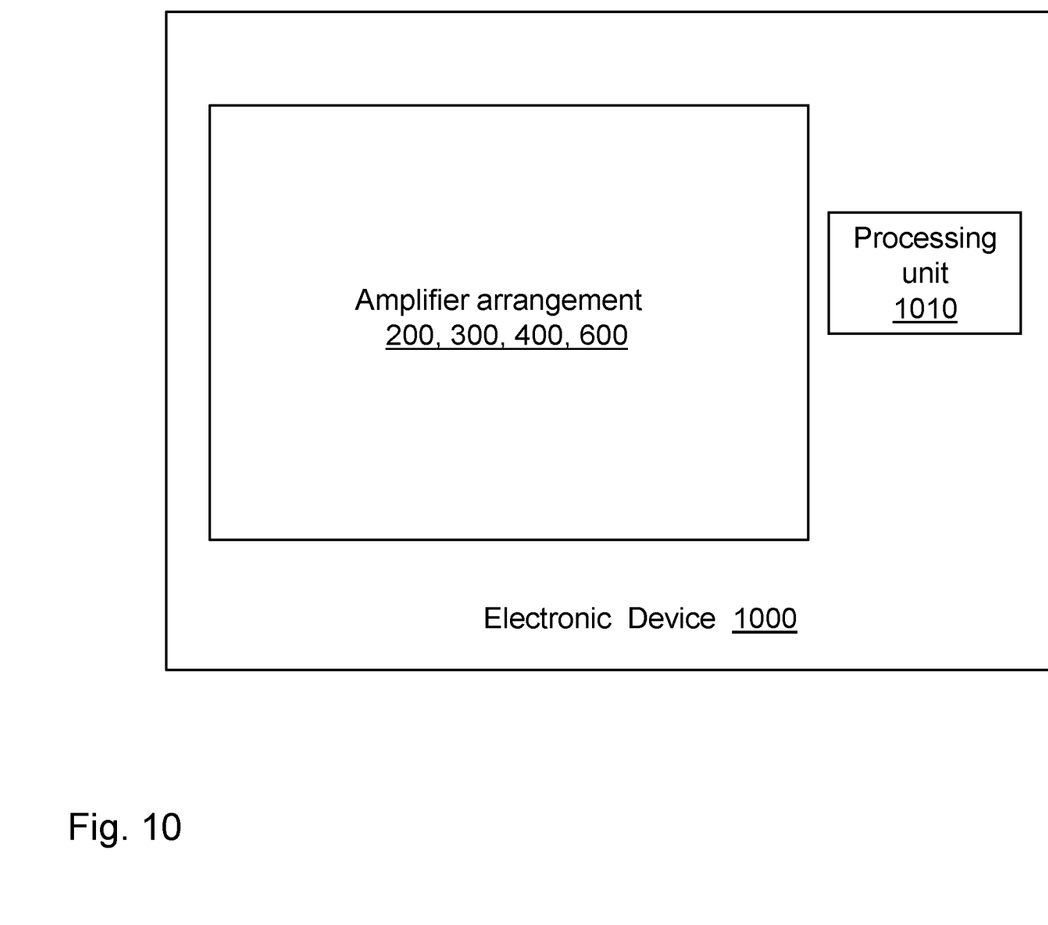
FIG. 10 is a block diagram showing an electronic device in which the power amplifier arrangement according to embodiments herein may be implemented.

The power amplifier arrangement 200, 300, 400, 600 according to embodiments herein may be employed in various electronic devices. FIG. 10 shows a block diagram for an electronic device 1000, which may be, e.g. a radio frequency transceiver, a wireless communication device, a user equipment, a mobile device, a base station or a radio network node etc. in a wireless communication systems, or any general electronic circuit or equipment which needs a power amplifier. The electronic device 1000 may comprise other units, where a processing unit 1010 is shown.

When using the word "comprise" or "comprising" it shall be interpreted as non-limiting, i.e. meaning "consist at least of".

The embodiments herein are not limited to the above described embodiments. Various alternatives, modifications and equivalents may be used. Therefore, the above embodiments should not be taken as limiting the scope of the invention, which is defined by the appended claims.

The invention claimed is:

1. A power amplifier arrangement for amplifying an input signal to produce an output signal, the power amplifier arrangement comprising:
   a plurality of N successive amplifier sections, wherein N is a positive integer that is greater than or equal to 2 and further wherein the plurality of N successive amplifier sections comprises a first amplifier section and a second amplifier section;
   a first input transmission line comprising multiple segments; and
   a first output transmission line comprising multiple segments, wherein
   each of the N successive amplifier sections comprises one or more first transistors distributed along the first input transmission line and the first output transmission line such that gates of the one or more first transistors are connected to respective segments of the first input transmission line and drains of the one or more first transistors are connected to respective segments of the first output transmission line,
   the first amplifier section is configured to amplify a first portion of the input signal, thereby producing a first portion of the output signal,
   the first portion of the input signal is associated with a first amplitude range and/or a first time interval of the input signal,
   the second amplifier section is configured to amplify a second portion of the input signal, which is different from the first portion of the input signal, thereby producing a second portion of the output signal,
   the second portion of the input signal is associated with a second amplitude range and/or a second time interval of the input signal, and
   the output signal is produced at an end of the first output transmission line by building up at least the first and second portions of the output signal,
   each of the N successive amplifier sections further comprises one or more second transistors, the power amplifier arrangement further comprises a second input transmission line comprising multiple segments and a second output transmission line comprising multiple segments, gates of the one or more second transistors are connected to respective segments of the second input transmission line, drains of the one or more second transistors are connected to respective segments of the second output transmission line, and each of the N successive amplifier sections is configured to amplify a portion of positive input signal to produce a portion of positive output signal at the first output transmission line and to amplify a portion of negative input signal to produce a portion of negative output signal at the second output transmission line.

2. The power amplifier arrangement according to claim 1, wherein the N portions of the input signal is partitioned by pre-shaping the N portions of the input signal by digital or analog shaping circuits before being input to each of the N successive amplifier sections.

3. The power amplifier arrangement according to claim 1, wherein lengths of the respective segments of the first output transmission line are non-equal.

4. The power amplifier arrangement according to claim 1, further comprising a wideband coupler to combine positive and negative output signals from the first and second output transmission lines.

5. The power amplifier arrangement according to claim 1, wherein the one or more second transistors are the same type as the respective one or more first transistors and are connected in differential with the respective one or more first transistors.

6. The power amplifier arrangement according to claim 5, further comprising a negatively coupled inductor pair or a center-tapped inductor to feed direct current (DC) to the differentially connected transistors.

7. The power amplifier arrangement according to claim 5, further comprising a balun or balanced-to-unbalanced transformer or a wideband 180-degree coupler to combine positive and negative output signals from the first and second output transmission lines.

8. A power amplifier arrangement for amplifying an input signal to produce an output signal, the power amplifier arrangement comprising:
a plurality of N successive amplifier sections, wherein N is a positive integer that is greater than or equal to 2 and further wherein the plurality of N successive amplifier sections comprises a first amplifier section and a second amplifier section;
a first input transmission line comprising multiple segments; and
a first output transmission line comprising multiple segments, wherein
each of the N successive amplifier sections comprises one or more first transistors distributed along the first input transmission line and the first output transmission line such that gates of the one or more first transistors are connected to respective segments of the first input transmission line and drains of the one or more first transistors are connected to respective segments of the first output transmission line,
the first amplifier section is configured to amplify a first portion of the input signal, thereby producing a first portion of the output signal,
the first portion of the input signal is associated with a first amplitude range and/or a first time interval of the input signal,
the second amplifier section is configured to amplify a second portion of the input signal, which is different from the first portion of the input signal, thereby producing a second portion of the output signal,
the second portion of the input signal is associated with a second amplitude range and/or a second time interval of the input signal, and
the output signal is produced at an end of the first output transmission line by building up at least the first and second portions of the output signal,
each of the N successive amplifier sections further comprises one or more second transistors stacked with the respective one or more first transistors,
the power amplifier arrangement further comprises a second input transmission line comprising multiple segments,
gates of the one or more second transistors are connected to respective segments of the second input transmission line,
drains of the one or more second transistors are connected to respective segments of the first output transmission line, and
each of the N successive amplifier sections is configured to amplify a portion of positive input signal and a portion of negative input signal to produce a portion of positive output signal and a portion of negative output signal at the first output transmission line.

9. An electronic device comprising a power amplifier arrangement according to claim 1.

10. The power amplifier arrangement according to claim 1, wherein
the gates of the one or more second transistors are directly connected to the respective segments of the second input transmission line, and
the drains of the one or more second transistors are directly connected to the respective segments of the second output transmission line.

11. The power amplifier arrangement according to claim 1, wherein the N successive amplifier sections are configured to divide the input signal into the N portions of the input signal.

12. The power amplifier arrangement according to claim 1, wherein
the first amplifier section comprises a first number of transistors,
the second amplifier section comprises a second number of transistors, and
the first number and the second number are different.

13. A power amplifier arrangement for amplifying an input signal to produce an output signal, the power amplifier arrangement comprising:
a plurality of N successive amplifier sections, wherein N is a positive integer that is greater than or equal to 2 and further wherein the plurality of N successive amplifier sections comprises a first amplifier section and a second amplifier section;
a first input transmission line comprising multiple segments; and
a first output transmission line comprising multiple segments, wherein
each of the N successive amplifier sections comprises one or more first transistors distributed along the first input transmission line and the first output transmission line such that gates of the one or more first transistors are connected to respective segments of the first input transmission line and drains of the one or more first transistors are connected to respective segments of the first output transmission line, the first amplifier section is configured to amplify a first portion of the input signal, thereby producing a first portion of the output signal, the first portion of the input signal is associated with a first amplitude range and/or a first time interval of the input signal, the second amplifier section is configured to amplify a second portion of the input signal, which is different from the first portion of the input signal, thereby producing a second portion of the output signal, the second portion of the input signal is associated with a second amplitude range and/or a second time interval of the input signal, and the output signal is produced at an end of the first output transmission line by building up at least the first and second portions of the output signal, the plurality of N successive amplifier sections further comprises a third amplifier section, the second amplifier section is disposed between the first amplifier section and the third amplifier section, the second amplifier section comprises a first end transistor, a second end transistor, and a plurality of middle transistors disposed between the first end transistor and the second end transistor, and the first output transmission line comprises a first end segment connected to the first end transistor, a second end segment connected to the second end transistor, and a plurality of middle segments disposed between the first end segment and the second end segment, and a length of the first end segment and a length of the second end segment are greater than a length of any of the plurality of middle segments.

\* \* \* \* \*